US008524101B2

(12) United States Patent
Chiba et al.

(10) Patent No.: US 8,524,101 B2
(45) Date of Patent: Sep. 3, 2013

(54) METHOD AND APPARATUS FOR MANUFACTURING SEMICONDUCTOR DEVICE, AND STORAGE MEDIUM

(75) Inventors: Yuki Chiba, Albany, NY (US); Shigeru Tahara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1187 days.

(21) Appl. No.: 12/155,746

(22) Filed: Jun. 9, 2008

(65) Prior Publication Data

US 2008/0314520 A1 Dec. 25, 2008

Related U.S. Application Data (60) Provisional application No. 60/935,926, filed on Sep. 6, 2007.

(30) Foreign Application Priority Data

Jun. 21, 2007 (JP) ................................. 2007-164170

(51) Int. Cl.
*B44C 1/22* (2006.01)
*C23F 1/00* (2006.01)
*H01L 21/461* (2006.01)

(52) U.S. Cl.
USPC ............................................ 216/67; 438/735

(58) Field of Classification Search
USPC ........................................................ 216/67
See application file for complete search history.

(56) References Cited

U.S. PATENT DOCUMENTS

| 6,187,632 B1 * | 2/2001 | Shuto et al. | 438/257 |
| 2005/0285173 A1 * | 12/2005 | Nagai et al. | 257/296 |
| 2007/0007567 A1 * | 1/2007 | Yaegashi et al. | 257/295 |
| 2007/0063241 A1 * | 3/2007 | Sashida et al. | 257/296 |
| 2007/0080382 A1 * | 4/2007 | Kikuchi et al. | 257/295 |
| 2007/0134924 A1 * | 6/2007 | Yaegashi | 438/697 |

FOREIGN PATENT DOCUMENTS

| JP | 06124925 A * | 5/1994 |
| JP | 2000-164715 | 6/2000 |
| JP | 2000-340636 A | 12/2000 |
| JP | 2005-197366 | 7/2005 |
| JP | 2006-339562 A | 12/2006 |

OTHER PUBLICATIONS

Momonoi et al., "Investigation of reduction in etch rate of isolated holes in SiOCH", 2006 Dry Process International Symposium, pp. 7 and 8.
Japanese Office Action mailed on Jan. 10, 2012 for Application No. 2007-164170 w/ English translation.
Notification of Reason for Rejection issued on Nov. 6, 2012 for Japanese Application No. 2007-164170 w/ English translation.

* cited by examiner

*Primary Examiner* — Rakesh Dhingra
(74) *Attorney, Agent, or Firm* — Smith, Gambrell & Russell, LLP (57) ABSTRACT

The present invention provides a method for manufacturing a semiconductor device. In the method, a connection hole such as a via hole is formed in an interlayer insulating film by plasma etching with high etching uniformity regardless of the array density of connection holes. In the method, an upper layer film having a mask pattern is formed on the interlayer insulating film present on a substrate. A gas required for dehydration is then supplied to the substrate under the condition that an upper surface of the interlayer insulating film is exposed in order to remove moisture from the interlayer insulating film. A portion of the interlayer insulating film is etched to form a connection hole in which an electrical connection portion is to be embedded.

13 Claims, 6 Drawing Sheets

METHOD AND APPARATUS FOR MANUFACTURING SEMICONDUCTOR DEVICE, AND STORAGE MEDIUM

CROSS REFERENCE TO RELATED APPLICATIONS

This application claims the benefit of Japanese Application Serial No. 2007-164170 filed on Jun. 21, 2007 and US. Provisional Application Ser. No. 60/935,926 filed on Sep. 6, 2007, the content of which is hereby incorporated by reference into this application.

BACKGROUND OF THE INVENTION

1. Field of the Invention

The present invention relates to a technique for etching an interlayer insulating film formed on a substrate.

2. Description of the Related Art

A process for manufacturing a semiconductor device includes a process (such as a dual damascene process) for forming a structure with multiple layers each having a wiring on a semiconductor wafer (hereinafter merely referred to as a wafer), which is a substrate. In the dual damascene process, a recessed portion including a hole (via hole) and a trench is formed in an interlayer insulating film. An electrical connection portion (via) is embedded in the via hole and serves to connect a wiring provided in an upper layer with a wiring provided in a lower layer. The trench is provided to embed the wiring provided in the upper layer. Copper for wiring is embedded in the recessed portion. After that, unnecessary copper embedded in the recessed portion is removed by chemical mechanical polishing (CMP) to form a circuit portion for a single layer.

The following film is known as the interlayer insulating film. That is, a low dielectric constant film (hereinafter referred to as a SiOCH film) contains silicon, oxygen, carbon and hydrogen and has a relative dielectric constant k as small as 2.0 to 3.2. A cap film containing $SiO_2$ or the like is formed immediately on the interlayer insulating film in order to improve adhesion of the interlayer insulating film to a sacrificial film or the like, which is present on the upper side of the interlayer insulating film or to protect the interlayer insulating film during the CMP in a post-process.

Some of integrated circuit chips, which are semiconductor devices, each have a via hole provided outside a region in which a circuit is present. Such a via hole is provided to confirm electrical characteristics and called a Kelvin via hole or Kelvin contact. The Kelvin via hole is mainly used to evaluate characteristics of a via hole present in the entire circuit by measuring electrical resistance of the integrated circuit after formation of the integrated circuit. In addition, The Kelvin via hole can be used to evaluate whether or not the via hole present in the circuit region of the chip is reliably formed.

Figure 5:
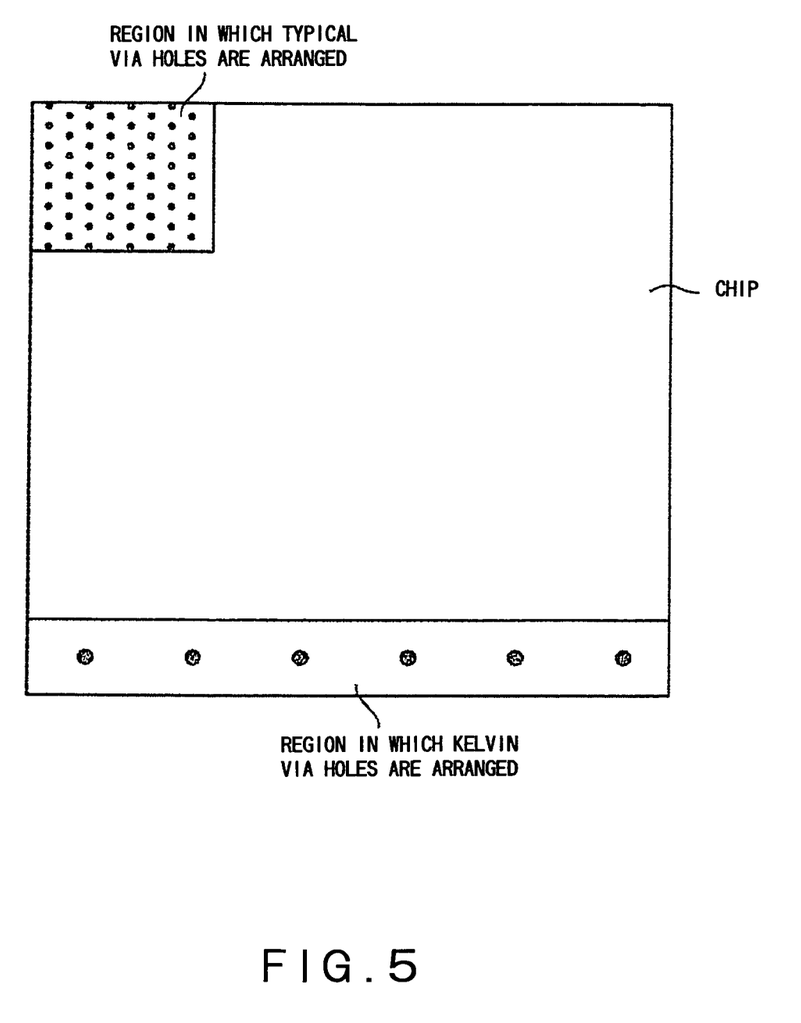
FIG. 5 is a diagram showing a difference between the density of typical via holes and the density of Kelvin via holes.

The arrangement density of the Kelvin via hole is considerably small, for example, one tenth the arrangement density of typical via holes provided in the integrated circuit or less (refer to FIG. 5). It has been reported that during a process for forming the via hole after the cap film is etched, the etching operability for forming the Kelvin via hole is degraded (Non-Patent Document 1: Momonoi, Y., Yonekura, K. and Izawa, M., "Investigation of reduction in etch rate of isolated holes in SiOCH" in Proc. Dry Process International Symposium 2-03, pp. 7-8). In such a case, the via hole may not extend to a metal wiring included in the lower layer. When the etching is performed for a longer period of time to prevent the etching for forming the Kelvin via hole from being stopped, a region corresponding to the typical via hole may be excessively etched, resulting in a larger via hole or unnecessary etching to the metal wiring provided in the lower layer.

Figure 6:
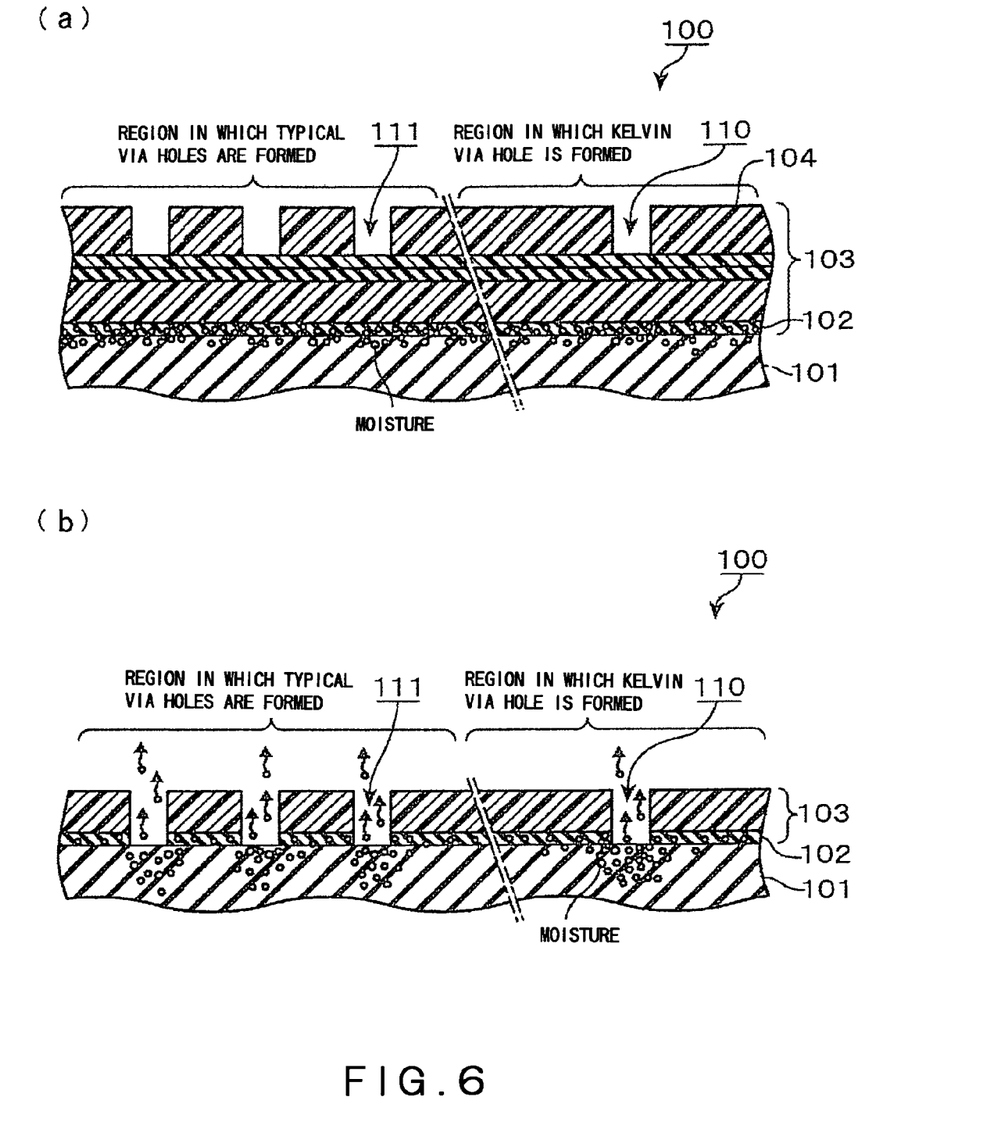
FIGS. 6(a) and 6(b) are explanatory diagrams each showing the state of an interlayer insulating film in a conventional process for manufacturing a semiconductor device.

As described above, the operability for etching a portion of the interlayer insulating film present in a region corresponding to the typical via hole is different from that for etching a portion of the interlayer insulating film present in a region corresponding to the Kelvin via hole when the etching is performed under the same conditions. The inventors estimate that the difference between the etching operability for forming the two types of via holes results from a difference between concentrations of water present around an upper surface of the interlayer insulating film. A description will be made of an estimated mechanism for causing the difference between the etch rates with reference to FIGS. 6(a) and (b).

FIGS. 6(a) and 6(b) are cross sectional views of a semiconductor device 100 before and during etching. In FIGS. 6(a) and 6(b), reference numeral 101 denotes an interlayer insulating film; 102, a cap film; 104, a photoresist film having a mask pattern in which a typical via hole 111 and a Kelvin via hole 110 are formed; and 103, an upper layer film including the cap film 102, the photoresist film 14 and another film.

The interlayer insulating film 101 is formed of a low dielectric constant material such as a SiOCH film and has a high hygroscopic property. The cap film 102 is formed of a $SiO_2$ film and has a high hygroscopic property. Especially, the $SiO_2$ film formed of an organic liquid such as TEOS (tetraethyl orthosilicate) or the like has a high hygroscopic property. Even during sequential formation of the interlayer insulating film 101 and the cap film 102 in a multi-chamber system having a vacuum transfer chamber with multiple chemical vapor deposition (CVD) apparatuses provided in the chamber, the interlayer insulating film 101 and the cap film 102 absorb a small amount of water present in the vacuum transfer chamber due to the respective hygroscopic properties. Recently, a resist having multiple layers is under consideration in order to efficiently perform the dual damascene process for embedding a copper wiring. If the multi-layer resist is used, the wafer is removed from the vacuum transfer chamber in the process for stacking the upper layer film 103 on the cap film 102, and transferred in the atmosphere to ensure a spin coated film is formed by means of spin coating in the atmosphere in some cases. In this case, a large amount of wafer is absorbed by the cap film 102. In addition, a portion of the interlayer insulating film 101, which is present on an end portion of the wafer W, is not covered with the cap film 102. When the portion of the interlayer insulating film 101, which is not covered with the cap film 102, is in contact with the atmosphere, the interlayer insulating film 101 may directly absorb water present in the atmosphere. It is considered that the water is maintained in the state of $H_2O$ molecules or OH groups in the cap film 102 or the interlayer insulating film 101. In the case where the water is maintained in the state of OH groups, water molecules are coupled with Si atoms contained in the SiOCH film constituting the interlayer insulating film 101 to generate the OH groups. Hereafter, the $H_2O$ molecules and OH groups are collectively called moisture.

As described above, moisture is absorbed by the interlayer insulating film 101 or the cap film 102 during the process or between the processes. In the process for forming a via hole in the interlayer insulating film 101, a portion of the cap film 102 is etched to expose a portion of the upper surface of the interlayer insulating film 101. After the exposure of the portion of the upper surface of the interlayer insulating film 101, moisture contained in the interlayer insulating film 101 gather around the typical via hole 111 and the Kelvin via hole 110 since the moisture attempts to disperse into the vacuum atmosphere. This may result from the fact that moisture directly absorbed by the interlayer insulating film 101 gather around the boundary between the cap film 102 and the interlayer insulating film 101 and moisture contained in the cap film 102 diffuse to the interlayer insulating film 101 and gather around the boundary between the cap film 102 and the interlayer insulating film 101 (refer to FIG. 6(a)).

Since the density of the typical via holes is high, the moisture can easily disperse into the vacuum atmosphere through the via holes 111. On the other hand, a large amount of the moisture gathers around each of the Kelvin via holes since the density of the Kelvin via holes is low.

For the abovementioned reason, the density of the moisture present around the upper surface of the interlayer insulating film 101 located under each of the Kelvin via holes 110 is much higher than that of the moisture present around the upper surface of the interlayer insulating film 101 located under each of the typical via holes 111. The large amount of the moisture is reacted with an etchant (active species) to inactivate the etchant, resulting in prevention of the progress of the etching. It is therefore considered that the prevention of the etching progress causes to degrade the operability for etching portions of the interlayer insulating film 101 present in the regions corresponding to the Kelvin via holes 110. In addition, it is considered that the etchant is inactivated by $H_2O$ molecules. The present inventors, however, consider the following mechanism as the cause of the inactivation of the etchant. That is, $H_2O$ molecules contained in the interlayer insulating film 101 are directed to and gather under each of the via holes 111. In this case, a portion of the interlayer insulating film 101 present under each of the via holes is exposed to plasma during the etching or the like. As a result, the bonds of molecules contained in the SiOCH film may be broken, and a large number of dangling bonds of Si atoms may be produced. When $H_2O$ molecules gather under the above condition, the $H_2O$ molecules are coupled with the dangling bonds of the Si atoms to form a large number of OH groups. It is considered that the key factor of inactivation of the etchant is the OH groups formed in the abovementioned way.

Non-Patent Document 1 has reported the comparison of a rate of etching a SiOCH film in the case where the SiOCH film is exposed to the atmosphere for a day after the formation of the film and a rate of etching a SiOCH film in the case where the SiOCH film is exposed to the atmosphere for a month after the formation of the film. Based on the report, the rate of etching the SiOCH film exposed to the atmosphere for a month is smaller than that of etching the SiOCH film exposed to the atmosphere for a day. In addition, the etching operability for forming a via hole is degraded in the SiOCH film exposed to the atmosphere for a month. The report describes that the degradation of the etching operability is caused by the difference between the amounts of moisture contained in the SiOCH film for the abovementioned periods of time. The abovementioned experimental results and consideration of the results confirm the abovementioned estimated mechanism in which the degradation of the etching operability for forming the Kelvin via hole is caused by moisture contained in the interlayer insulating film 101.

SUMMARY OF THE INVENTION

It is, therefore, an object of the present invention to provide a method and an apparatus for manufacturing a semiconductor device, and a storage medium for storing data on the manufacturing method. In the manufacturing method, a connection hole such as a via hole is formed in an interlayer insulating film by plasma etching with high etching uniformity regardless of the array density of connection holes.

The method for manufacturing a semiconductor device according to an aspect of the present invention comprises the steps of: preparing a substrate having an interlayer insulating film formed thereon; forming an upper layer film having a mask pattern on the interlayer insulating film in such a manner that a portion of an upper surface of the interlayer insulating film is exposed to an atmosphere; supplying a gas required for dehydration to the substrate with the portion of the upper surface of the interlayer insulating film exposed to the atmosphere to remove moisture from the interlayer insulating film; and etching a portion of the interlayer insulating film to form a connection hole in which an electrical connection portion is to be embedded.

In the method according to another aspect of the present invention, the upper layer film includes a cap film formed on the upper surface of the interlayer insulating film and adapted to improve adhesion of the interlayer insulating film to a film present on the cap film or to protect the interlayer insulating film during a post-polishing process, and a hole is formed in the cap film so that the portion of the upper surface of the interlayer insulating film is exposed to the atmosphere.

In the method according to still another aspect of the present invention, the cap film has a high hygroscopic property.

In the method according to still another aspect of the present invention, the cap film is a silicon oxide film formed from organic liquid vapor containing metal alkoxide.

In the method according to still another aspect of the present invention, the upper layer film includes a sacrificial film, which is removed during the etching.

In the method according to still another aspect of the present invention, the step of forming the upper layer film includes a sub-step for forming a coated film on an upper surface of the cap film in the atmosphere, the coated film being removed during the etching.

In the method according to still another aspect of the present invention, the interlayer insulating film is a low dielectric constant film containing silicon, oxygen, carbon and hydrogen.

In the method according to still another aspect of the present invention, the connection hole includes a hole having an electrical connection portion embedded therein and used to evaluate the electrical connection portion serving as a part of an integrated circuit.

In the method according to still another aspect of the present invention, the gas required for dehydration is a dipivaloylmethane gas.

In the method according to still another aspect of the present invention, the moisture is removed from the interlayer insulating film while the substrate, which has the portion of the upper surface of the interlayer insulating film exposed to the atmosphere, is heated.

In the method according to still another aspect of the present invention, the substrate having the portion of the upper surface of the interlayer insulating film exposed to the atmosphere is heated at a temperature between 50° C. and 300° C.

An apparatus for manufacturing a semiconductor device according to an aspect of the present invention, wherein etching is performed on a substrate having an interlayer insulating film and an upper layer film formed on the interlayer insulating film, the upper layer film having a mask pattern in such a manner that a portion of an upper surface of the interlayer insulating film is exposed to an atmosphere, the apparatus comprises: a stage provided in a process chamber and adapted to hold the substrate; first gas supply means for supplying an etching gas into the process chamber; second gas supply means for supplying a gas required for dehydration into the process chamber; plasma generation means for converting the etching gas into plasma; discharge means for evacuating the process chamber to vacuum; and control means for controlling the first and second gas supply means, the plasma generation means and the discharge means to cause each means to perform etching on the substrate having the interlayer insulating film and the upper layer film having the mask pattern by using the etching gas converted into plasma, supply the gas required for dehydration to the substrate under the condition that a hole is formed in the upper layer film to thereby expose a portion of an upper surface of the interlayer insulating film to the atmosphere in order to remove moisture from the interlayer insulating film, and etch a portion of the interlayer insulating film by using the etching gas converted into plasma in order to form a connection hole in which an electrical connection portion is to be embedded.

In the apparatus according to another aspect of the present invention, the upper layer film includes a cap film formed on the upper surface of the interlayer insulating film and adapted to improve adhesion of the interlayer insulating film to a film present on the cap film or to protect the interlayer insulating film during a post-polishing process, and the controller is operated to form a hole in the cap film in order to expose the portion of the interlayer insulating film.

In the apparatus according to still another aspect of the present invention, the gas required for dehydration is a dipivaloylmethane gas.

The apparatus according to still another aspect of the present invention further comprises heating means for heating the substrate held on the stage, in which the control means controls the heating means to cause the heating means to heat the substrate under the condition that the portion of the upper surface of the interlayer insulating film is exposed to the atmosphere.

In the apparatus according to still another aspect of the present invention, the control means controls the heating means so that the substrate having the portion of the upper surface of the interlayer insulating film exposed to the atmosphere is heated at a temperature between 50° C. and 300° C.

The storage medium according to the present invention stores a computer program for causing a computer to execute operations in accordance with a method for manufacturing a semiconductor device, the method comprising the steps of: preparing a substrate having an interlayer insulating film formed thereon; forming an upper layer film having a mask pattern on an upper surface of the interlayer insulating film present on the substrate in such a manner that a portion of the upper surface of the interlayer insulating film is exposed to an atmosphere; supplying a gas required for dehydration to the substrate to remove moisture from the interlayer insulating film with the portion of the upper surface of the interlayer insulating film exposed to the atmosphere; and etching a portion of the interlayer insulating film to form a connection hole in which an electrical connection portion is to be embedded.

According to the present invention, after the upper layer film having the mask pattern is formed on the interlayer insulating film present on the substrate, the gas required for dehydration is supplied to the substrate under the condition that the portion of the upper surface of the interlayer insulating film is exposed to the atmosphere to remove moisture contained in the interlayer insulating film. It is, therefore, possible to prevent degradation of the operability for etching a portion of the interlayer insulating film due to the inactivation of the etchant resulting from the reaction of the etchant with moisture during the etching. Especially, the etching operability is degraded for a region, in which the density of connection holes (via holes) arranged is low, due to moisture. The connection holes arranged with low density are Kelvin via holes. Moisture present around the Kelvin via holes and moisture present around the typical via holes are removed. Moisture is then almost absent around the two types of via holes. The rate of etching the typical via hole and the rate of etching the Kelvin via hole are therefore nearly equal to each other to allow uniform via holes to be formed on and above the substrate.

BEST MODE FOR CARRYING OUT THE INVENTION

Figure 1:
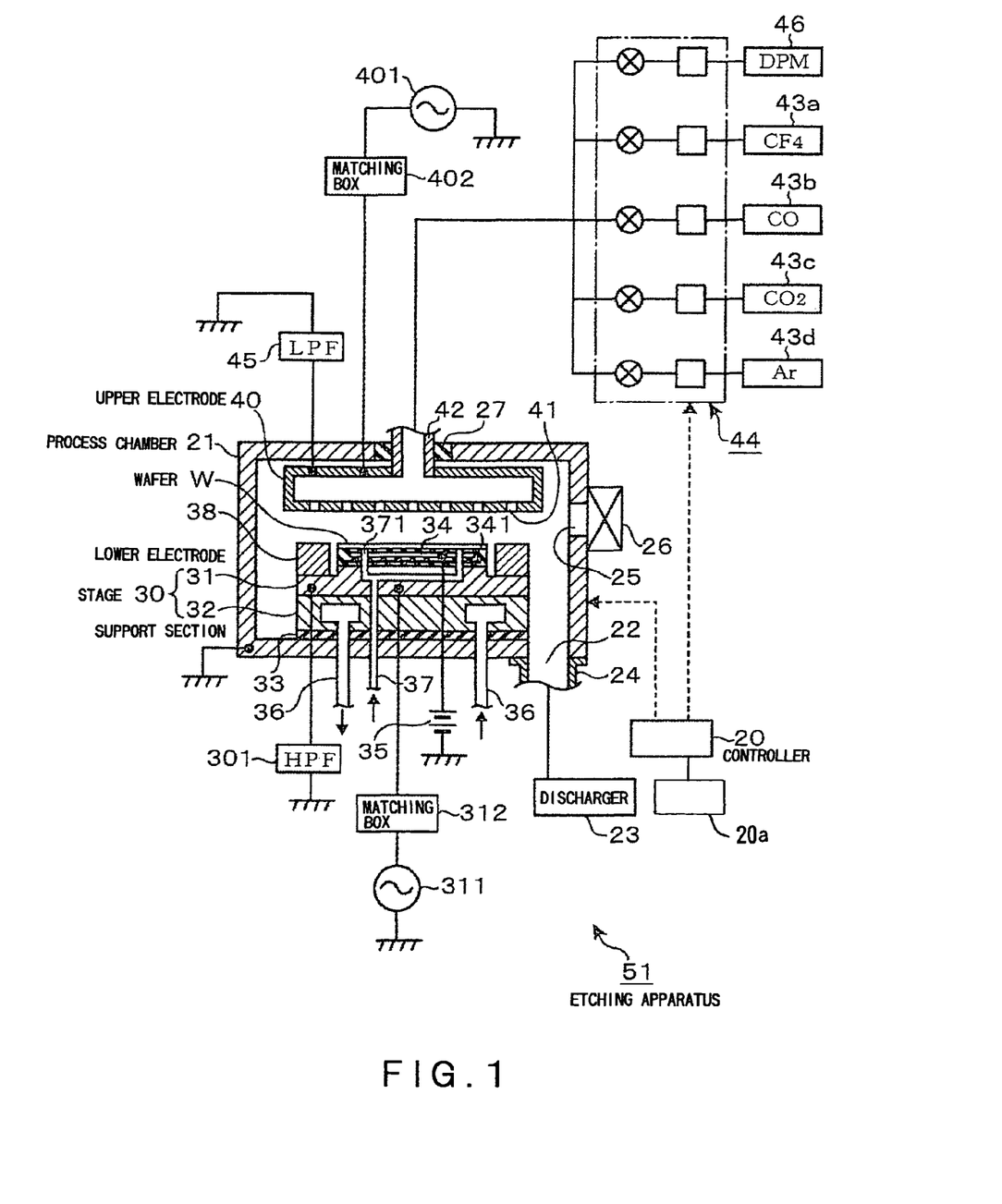
FIG. 1 is a vertical cross sectional view of an etching apparatus according to an embodiment of the present invention.

A description will be made of an etching apparatus 51 to be used in an embodiment of the present invention with reference to FIG. 1. The etching apparatus 51 includes: a vacuum process chamber (hereinafter merely referred to as a process chamber) 21; a stage 30 provided on a central portion of a bottom surface of the process chamber 21; and an upper electrode 40 provided to an upper surface of the process chamber 21. The process chamber 21 has a space in which a plasma etching process is performed on a wafer W having a resist pattern thereon. The process chamber 21 has a discharge outlet 22 extending through the bottom surface thereof. The discharge outlet 22 is connected to a discharger 23 through a discharge tube 24. The discharger 23 includes a vacuum pump and the like. The process chamber 21 also has a transfer port 25 provided in a side wall thereof. The transfer port 25 serves to transfer the wafer W between the inside and outside of the process chamber 21. The wafer W is carried by an external transfer unit. The transfer port 25 can be opened and closed by means of a gate valve 26. The process chamber 21 is grounded.

The stage 30 includes a lower electrode 31 and a support section 32 provided under the lower electrode 31 and supporting the lower electrode 31. The stage 30 is fixed to the bottom surface of the process chamber 21 through an insulating member 33. An electrostatic chuck 34 is provided on the stage 30 and connected to a high-voltage direct-current power supply 35. The high-voltage direct-current power supply 35 applies a voltage to the electrostatic chuck 34 to allow the wafer W (substrate) to be electrostatically absorbed on the stage 30.

The stage 30 has a cooling medium flow path 36 formed therein. A cooling medium flows in the cooling medium flow path 36. The cooling medium has a predetermined temperature and is capable of cooling the wafer W held on the stage 30 to a desired temperature. In addition, the stage 30 has a gas flow path 37 formed therein. The gas flow path 37 is adapted to cause a thermally conductive backside gas such as a helium gas to flow to a back surface of the wafer W. The gas flow path 37 is communicated with a plurality of gas supply holes 371 formed in an upper surface of the stage 30 (electrostatic chuck 34).

The lower electrode 31 is connected to a high frequency power supply 311 through a matching box 312. The high frequency power supply 311 supplies high frequency power of, for example, 13.56 MHz. The high frequency power supply 311 applies high frequency bias power to the wafer W to attract, to an upper surface of the wafer W, ions contained in plasma generated by an upper electrode (described later) 40. In addition, the lower electrode 31 is grounded through a high-pass filter (HPF) 301.

The process chamber 21 has a focus ring 38 provided on an outer circumferential end portion of the lower electrode 31. The focus ring 38 surrounds the electrostatic chuck 34. In addition, the focus ring 38 serves to cause plasma generated in the process chamber 21 to be focused on the upper surface of the wafer W held on the stage 30.

The upper electrode 40 is hollow and has a disk shape. The upper electrode 40 has a large number of gas supply holes 41 formed in a lower surface thereof, and constitutes a gas shower head. The gas supply holes 41 are uniformly arranged, for example. Each of the gas supply holes 41 is adapted to diffuse an etching gas and the like (described later) into the process chamber 21. In addition, the upper electrode 40 has an upper central portion connected to a gas supply tube 42. The gas supply tube 42 extends through an insulating member 27 provided in the upper central portion of the process chamber 21. The gas supply tube 42 is divided into a plurality of tubes on the upstream side thereof. The divided gas supply tubes are connected to respective gas supply sources 43a to 43d. The gas supply sources 43a to 43d store etching gases $CF_4$, CO and $CO_2$, and an argon (Ar) gas, respectively. The etching gases $CF_4$, CO and $CO_2$ are used to etch films staked on the wafer W. The Ar gas is used to adjust the concentration(s) of the etching gas(es). In FIG. 1, reference numeral 44 denotes a flow rate controller, which includes valves and mass flow controllers and controls amounts of the gases to be supplied to the process chamber 21. The gas supply tube 42, the gas supply sources 43a to 43d and the flow rate controller 44 constitute a first gas supply unit.

The upper electrode 40 is connected to a high frequency power supply 401 through a matching box 402. The high frequency power supply 401 supplies high frequency power of, for example, 60 MHz, which is higher than that supplied by the high frequency power supply 311 provided on the side of the lower electrode 31. The upper electrode 40 serves to convert the etching gas(es) supplied from the gas supply tube 42 into plasma. In addition, the upper electrode 40 is grounded through a low-pass filter (LPF) 45. The upper and lower electrodes 40 and 31 constitute a plasma generation unit.

The etching apparatus 51 has a controller 20, which is a computer, for example. The controller 20 is, for example, a computer having a central processing unit (CPU) and a program (not shown in FIG. 1). The program includes a step group (commands) of controlling the etching apparatus 51, i.e., a step of supplying any of the etching gases based on the film to be etched, a step of performing etching using the etching gas converted into plasma, a step of dehydrating the upper surface of the wafer W during the etching (described later), and the like. The program is stored in a storage medium 20a, such as a hard disk, a compact disc, a magnet optical disc and a memory card, and read from the storage medium to be installed on the computer.

The etching apparatus 51 according to the present embodiment has a function of preventing degradation of the etching operability due to moisture contained in the interlayer insulating film 101, which is described in "Description of the Related Art." The construction of the etching apparatus 51, which is related to the function, will be described.

The etching apparatus 51 has a second gas supply unit for supplying vapor of a dipivaloylmethane (DPM) gas required for dehydrating the upper surface of the wafer W during the etching. The second gas supply unit serves as the function for preventing degradation of the etching operability. The second gas supply unit includes the gas supply tube 42, a DPM supply section 46 and the flow rate controller 44. The DPM supply section 46 is connected to one of the divided gas supply tubes 42. The flow rate controller 44 is connected to each of the divided gas supply tubes 42. The DPM supply section 46 has a storage section storing DPM which is a liquid source. In addition, The DPM supply section 46 has a vaporizer (not shown in FIG. 1) to gasify the DPM stored in the storage section and supply the DPM gas to the process chamber 21.

A heating unit 341 is provided in the electrostatic chuck 34 and composed of a resistance heating element. The heating unit 341 is controlled by a temperature controller (not shown in FIG. 1) to heat the wafer W held on the stage 30 to a predetermined temperature.

A description will be made of a series of processes for forming multiple layers each including a wiring on the wafer W using the etching apparatus 51 according to the embodiment with reference to FIGS. 2(a) to 2(c) and 3(a) to 3(c). FIGS. 2(a) to 2(c) and 3(a) to 3(c) are cross sectional views of the semiconductor device and show processes for manufacturing the semiconductor device in a phased manner. In the description below, the following films and wiring are already formed on the wafer W: an interlayer insulating film 91; a copper wiring 92; a cap film 93 for the copper wiring; and a barrier film 94 for preventing a copper ion from diffusing from the copper wiring 92, which serve as a foundation layer. The following description is made of a process for forming a wiring on the copper wiring 92.

First, the gate valve 26 of the etching apparatus 51 is opened. The external transfer unit then carries the wafer W in the process chamber 21 through the transfer port 25 and puts the wafer W on the stage 30. In this case, the following films are already stacked in the following order on the barrier film 94 of the foundation layer 91-94: an interlayer insulating film 10 in which a via hole is to be formed by means of the etching apparatus 51; a cap film 11 serving to improve adhesion of the interlayer insulating film 10 to a layer present on the cap film 11 and protect the interlayer insulating film 10 in a post-chemical mechanical polishing process; a bottom photoresist film 12 serving to improve resistance of a resist to etching; an oxide film 13 serving as a mask during etching of the bottom photoresist film 12; a reflection prevention film 14 serving to improve resolution during photoresist exposure; and a photoresist film 15 having a pattern formed therein to form a via hole (FIG. 2(a))

Figure 2:
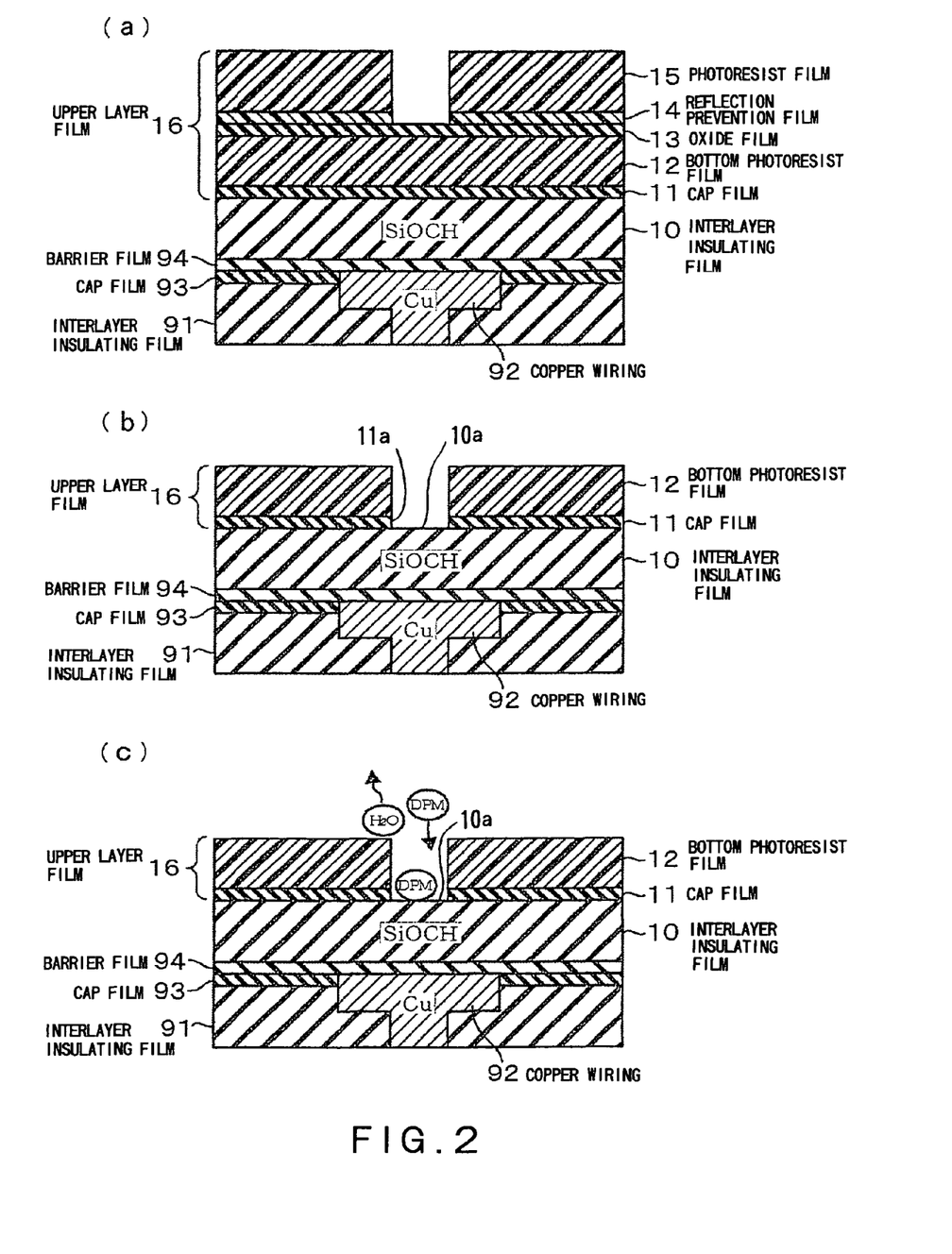
FIGS. 2(a) to 2(c) are explanatory diagrams showing processes for manufacturing a semiconductor device according to the embodiment.

Among the films 10-15, the interlayer insulating film 10 is, for example, a SiOCH film formed by plasma chemical vapor deposition (CVD) using an oxygen gas and vapor of an organic liquid source containing an alkylsilane gas (Si$(C_nH_{2n+1})_mH_{4-m}$). The cap film 11 and the oxide film 13 are, for example, SiO$_2$ films formed by plasma CVD using an oxygen gas and vapor of an organic liquid source containing metal alkoxide such as tetraethyl orthosilicate (TEOS). The bottom photoresist film 12, the reflection prevention film 14 and the photoresist film 15 are formed by coating respective film materials in the atmosphere by, for example, spin coating. The cap film 11, the bottom photoresist film 12, the oxide film 13, the reflection prevention film 14, and the photoresist film 15 constitute an upper layer film 16 present on the interlayer insulating film 10. The films 12 to 15 except for the cap film 11 serve as sacrificial films during the etching.

The wafer W has a laminated structure with the abovementioned films stacked thereon, and is placed on the stage 30. The external transfer unit is retracted from the process chamber 21, and the gate valve 26 is then closed. In order to etch the reflection prevention film 14 and the oxide film 13, the discharger 23 is operated to set the pressure within the process chamber 21 to vacuum pressure within a range from 6.7 to 13.3 Pa (50 to 100 mTorr), for example, vacuum pressure of 10 Pa (75 mTorr). Under the condition that the vacuum pressure within the process chamber 21 is maintained, the Ar gas is supplied from the gas supply source 43d into the process chamber 21, while the CF$_4$ gas is supplied from the gas supply source 43a at a flow rate of 100 to 300 standard cubic centimeters (sccm) into the process chamber 21. High frequency power within a range from 500 to 1000 W, for example, high frequency power of 750 W is then applied to the upper and lower electrodes 40 and 31 to convert the supplied Ar and CF$_4$ gases into plasma thereby etching the reflection prevention film 14 and the oxide film 13 in accordance with the pattern of the photoresist film 15.

After a predetermined time elapses, the application of the high frequency power and the supply of the gases are stopped. The process chamber 21 is evacuated by the discharger 23. Then, a process for etching the bottom photoresist film 12 is performed. In the process for etching the bottom photoresist film 12, the discharger 23 discharges a gas(es) from the process chamber at an adjusted discharge rate to reduce the pressure within the process chamber 21 to pressure within a range of 1.3 to 4.0 Pa (10 to 30 mTorr), for example, pressure of 2.7 Pa (20 mTorr). The gas supply sources 43b and 43c supply the CO gas and the CO$_2$ gas at a flow rate of 50 to 100 sccm and at a flow rate of 100 to 300 sccm, respectively. The same high frequency power as that applied in the previous process is then applied to the upper and lower electrodes 40 and 31 to convert the CO gas and the CO$_2$ gas into plasma thereby etching the bottom photoresist film 12.

Then, the application of the high frequency power and the supply of the gases are stopped. The process chamber 21 is evacuated by the discharger 23. Then, a process for etching the cap film 11 is performed. In the process, the cap film 11 is etched under the same conditions of the pressure within the process chamber 21, the flow rates of the etching gases (CF$_4$ and Ar gases) and the high frequency power applied to the upper and lower electrodes 40 and 31 as those of the process for etching the oxide film 13 and the reflection prevention film 14. During the abovementioned processes, the photoresist film 15, the reflection prevention film 14 and the oxide film 13 are removed to ensure that the bottom photoresist film 12 remains as the top film of the upper layer film 16 as shown in FIG. 2(b).

After the etching is performed for a predetermined time, a hole 11a is formed in the cap film 11 to ensure that a portion (hereinafter referred to as an upper surface portion) 10a of an upper surface of the interlayer insulating film 10 is exposed (FIG. 2(b)). In this case, the density of wafer components present around the upper surface of the interlayer insulating film 10 is high. This state of the interlayer insulating film 10 is similar to the state in which moisture contained in the interlayer insulating film 101 gather around via holes 110 and 111 since the moisture attempts to disperse into the atmosphere within the process chamber 21 due to the removal of portions of the cap film 102 as described in "Description of the Related Art" with reference to FIG. 6(b). The density of moisture is especially high around the Kelvin via hole 110. The interlayer insulating film 101, the cap film 102 and the upper layer film 103 shown in FIG. 6(b) correspond to the interlayer insulating film 10, the cap film 11 and the upper layer film 16 shown in FIG. 2(b), respectively.

When the etching is continuously performed on the interlayer insulating film 10 under the condition that the density of moisture present around the upper surface of the interlayer insulating film 10 is high, the etching gases are reacted with the moisture and then consumed. As a result, the etching operability is degraded. In the etching apparatus according to the present embodiment, the hole is formed in the cap film 11 to ensure that the portion of the upper surface of the interlayer insulating film 10 is exposed. After the exposure of the portion of upper surface of the interlayer insulating film 10, the DPM gas required for dehydration is supplied into the process chamber 21 to remove moisture from the exposed portion of the interlayer insulating film 10. It is, therefore, possible to prevent degradation of the etching operability.

Next, the dehydration process will be described. After the start of the etching, a predetermined time elapses and the hole 11a is formed in the cap film 11 to ensure that the upper surface portion 10a of the interlayer insulating film 10 is exposed. The application of the high frequency power and the supply of the gases are then stopped. The process chamber 21 is evacuated by the discharger 23, and a main valve (not shown) provided on the downstream side of the discharge tube 24 is closed. Then, supply of a cooling medium from the cooling medium flow path 36 is stopped. The heating unit 341 is then operated to heat the wafer W held on the stage 30 to a temperature within a range of 50 to 300° C., for example, a temperature of 150° C. The DPM supply section 46 then supplies the DPM gas into the process chamber 21 to ensure that the pressure within the process chamber 21 is set to pressure of, for example, 266 Pa (2 Torr).

The DPM gas supplied in the process chamber 21 reaches the upper surface of the interlayer insulating film 10 through the hole 11a formed by the etching, as shown in FIG. 2(c). There is a tendency that the DPM gas releases a proton (H$^+$). The proton (H$^+$) may be coupled with an OH group contained in the interlayer insulating film 10 to form an H$_2$O molecule, which is released from the interlayer insulating film 10. This promotes dehydration of the upper surface of the interlayer insulating film 10. It is considered that, after the dehydration process using the DPM gas, moisture present around the upper surface of the interlayer insulating film 10 can be removed to sufficiently suppress degradation of the etching operability due to the fact that the etchant is reacted with moisture and inactivated. In other words, it is considered that the moisture can be removed to ensure that the rate of the etching for forming the Kelvin via hole 110 is substantially the same as that of the etching for forming the typical via hole 111 under which the amount of moisture is small.

As described above, the DPM gas is supplied into the process chamber 21. After several seconds to several ten seconds elapse under the condition that the supplied DPM gas is present in the process chamber 21, the above-mentioned main valve is opened to evacuate the process chamber 21. The heating operation of the heating unit 341 is stopped, and the cooling medium is supplied from the cooling medium flow path 36. Then, a portion of the interlayer insulating film 10 is etched under the same conditions as those of the process for etching the cap film 11. Then, a Kelvin via hole 17 is formed in the interlayer insulating film 10 as shown in FIG. 3(a).

After the Kelvin via hole 17 is formed through the processes described above, an ashing process is performed in the process chamber 21. In the ashing process, an oxygen gas is supplied into the process chamber 21 and high frequency power is applied to the upper electrode 40 to generate plasma. The bottom photoresist film 12 is then removed by the plasma in the ashing process. After that, the wafer W is carried from the process chamber 21 to a coating apparatus, and a resist pattern is formed. After the formation of the resist pattern, the wafer W is carried into the process chamber 21 in order to form a trench 18 in the interlayer insulating film 10 by using the resist pattern.

Figure 3:
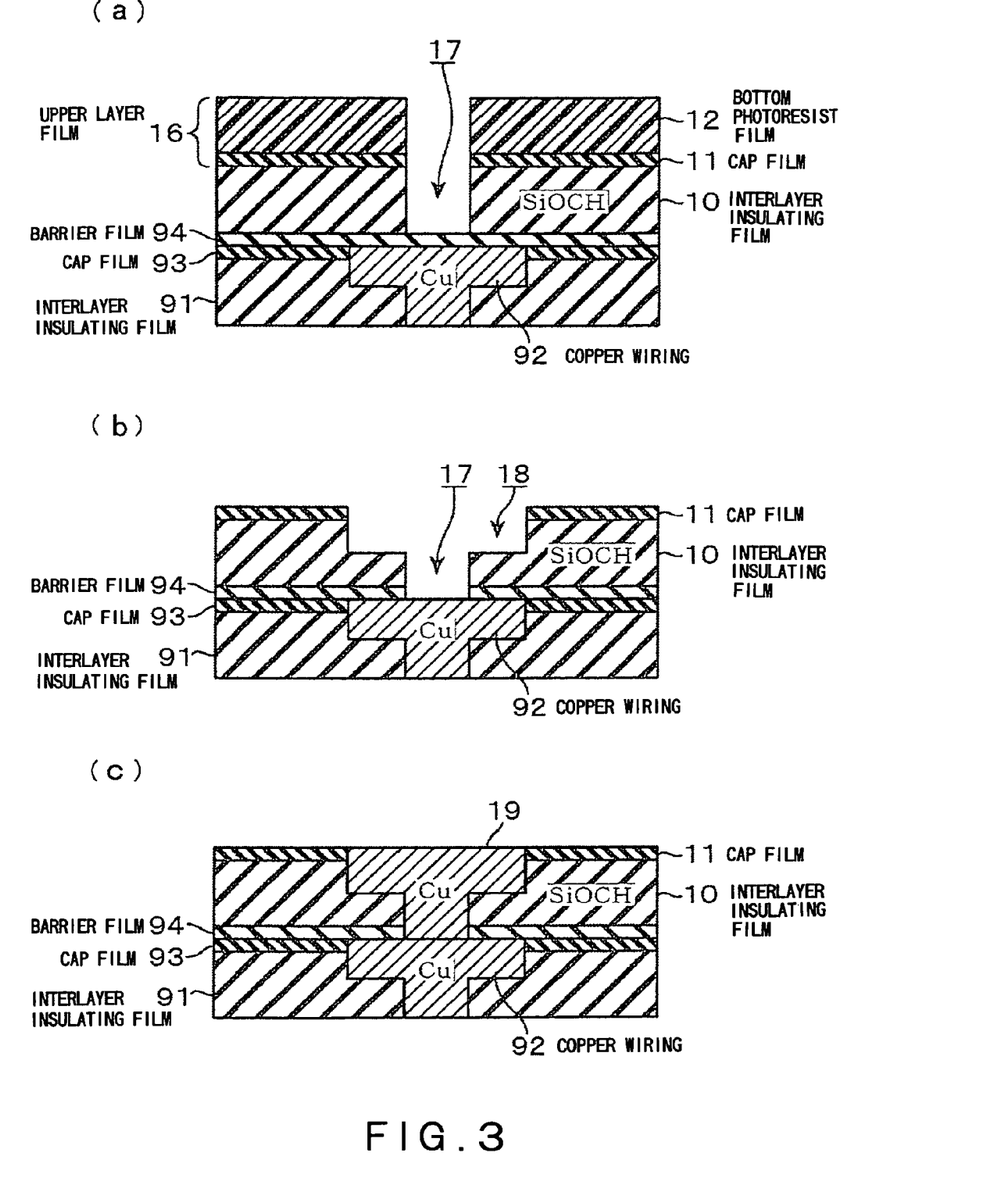
FIGS. 3(a) to 3(c) are explanatory diagrams showing processes for manufacturing the semiconductor device according to the embodiment.
Figure 4:
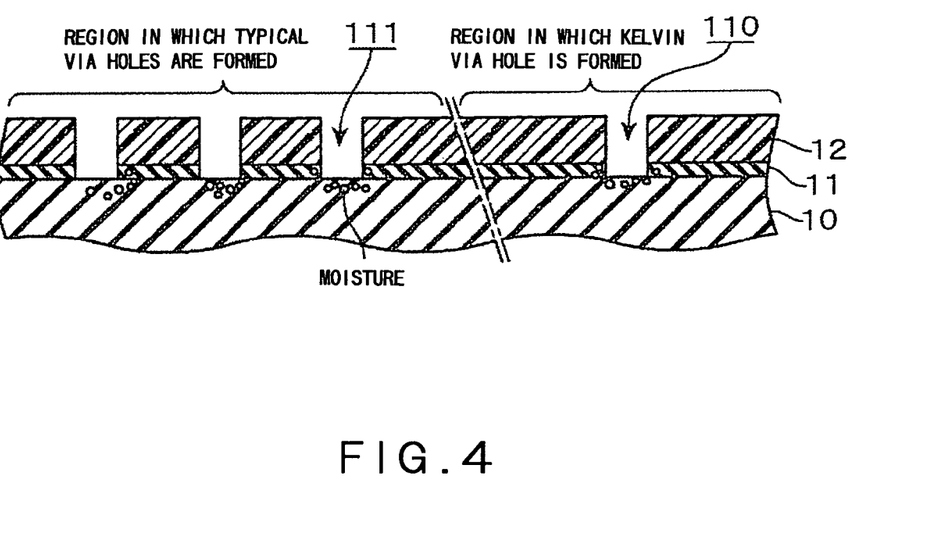
FIG. 4 is an explanatory diagram showing the state of an interlayer insulating film after a dehydration process.

As shown in FIG. 3(b), the via hole 17 and the trench 18 are formed in the interlayer insulating film 10. Copper is then embedded in the via hole 17 and the trench 18 by CVD or the like. After that, chemical mechanical polishing (CMP) is performed to form a single-layer wiring structure (copper wiring 19) as shown in FIG. 3(c). A portion of the copper wiring 19, which is embedded in the via hole 17, serves as an electrical connection with the copper wiring 92 provided under the copper wiring 19.

In the present embodiment described above, the following effect can be obtained. The upper layer film 16 is formed on the interlayer insulating film 10 present on the wafer W and includes the photoresist film 15 having the mask pattern. A portion of the upper layer film 16 is then etched to ensure that a portion of the interlayer insulating film 10 is exposed. The DPM gas required for dehydration is supplied to the wafer W with the portion of the interlayer insulating film 10 exposed. Moisture contained in the interlayer insulating film 10 can be removed by the DPM gas. This prevents degradation of the etching operability due to the fact that the etchant is reacted with moisture and inactivated.

Degradation of the etching operability is remarkable for the Kelvin via hole around which another via hole is not present. In the present embodiment, moisture contained in the interlayer insulating film 10 around the Kelvin via holes 110 and the typical via holes 111 are removed to ensure that the amount of moisture contained in the interlayer insulating film 10 around the Kelvin via holes 110 and the typical via holes 111 is extremely small. The rates of the etching for forming the Kelvin via hole 110 and the typical via hole 111 are nearly equal to each other. Therefore, the Kelvin via holes 110 and the typical via holes 111 present in the integrated circuit can be appropriately formed.

In the present embodiment described above, the DPM gas is used for the dehydration process. The gas for dehydration process, however, is not limited to the DPM gas. A silazane based gas, such as a tetramethyldisilazane (TMDS) gas may be used as a gas required for the dehydration of the interlayer insulating film 10. In addition, the interlayer insulating film 10, which is to be dehydrated, is not limited to the low dielectric constant film such as the SiOCH film. The interlayer insulating film 10 may be a $SiO_2$ film or SiOF film. In this case, the cap film 11 may not be included in the upper layer film 16. A mask pattern for formation of the via hole is formed in the upper layer film 16 to ensure that a portion of the upper surface of the interlayer insulating film 10 is exposed to the atmosphere. The interlayer insulating film 10 is then dehydrated to obtain the same effect as that in the present embodiment described above. It is considered that this results from the following fact. That is, the $SiO_2$ film is formed by CVD or the like and is exposed to the atmosphere to absorb moisture present in the atmosphere. After that, a similar effect to that described with reference to FIGS. 6(a) and 6(b) occurs during the process for forming the upper layer film 16 on the $SiO_2$ film.

The present invention may include the following method. That is, the photoresist film 15 having the mask pattern is formed directly on the interlayer insulating film 10 outside the process chamber 21. The wafer W having the interlayer insulating film 10 and the photoresist film 15 is then carried into the process chamber 21. The gas required for the dehydration process is supplied into the process chamber 21. A portion of the interlayer insulating film 10 is then etched based on the mask pattern of the photoresist film 15. That is, the mask pattern is formed and a portion of the upper surface of the interlayer insulating film 10 is exposed before the wafer W is carried into the process chamber 21. In the present embodiment, the Kelvin via holes 110 are provided to confirm electrical characteristics. The Kelvin via holes 110, however, may be formed in a region in which the density of the via holes is low.

In the present embodiment, a predetermined amount of the DPM gas is supplied into the air-tight process chamber 21 in terms of reduction in cost. The present invention, however, is not limited to the method for supplying the gas required for the dehydration process. The gas required for the dehydration process may be continuously supplied into the process chamber 21 while the discharger 23 is operated to evacuate the process chamber 21.

EXPERIMENTAL EXAMPLES

In order to confirm the ability to dehydrate a SiOCH film by means of the DPM gas and the effect of a temperature at which the wafer W is heated, etching and ashing processes are performed on the wafer W having the SiOCH film thereon to form an OH group around the upper surface of the SiOCH film and to then cause the SiOCH film to be in a similar state to that of the interlayer insulating film 10 having moisture absorbed therein. Then, the dehydration process is performed on the SiOCH film by means of the DPM gas. Under the condition that the DPM gas is present in the process chamber 21 to ensure that pressure within the process chamber 21 is set to pressure of 266 Pa (2 Torr), the wafer W having the SiOCH film formed thereon is placed in the process chamber 21 for 150 seconds and maintained at temperatures of 150° C., 200° C. and 250° C. After the dehydration process, pure water is dropped onto the wafer W to measure a contact angle and the amount of moisture remaining in the SiOCH film by thermal desorption spectroscopy (TDS).

Experimental Example 1

The dehydration process is performed on the wafer W having the SiOCH film formed therein, which has a temperature of 150° C.

Experimental Example 2

The dehydration process is performed on the wafer W having the SiOCH film formed therein, which has a temperature of 200° C.

Experimental Example 3

The dehydration process is performed on the wafer W having the SiOCH film formed therein, which has a temperature of 250° C.

Comparative Example 1

The etching and ashing processes are performed on the wafer W having the SiOCH film formed therein, and the dehydration process is not performed on the wafer W having the SiOCH film formed therein.

Results of the above experimental examples are shown in Table 1. Each of the contact angles shown in Table 1 is formed between the upper surface of the SiOCH film and a tangent to a curved surface of a droplet at a point at which the curved surface of the droplet intersects with the upper surface of the SiOCH film. The larger the contact angle, the higher hydrophobic property the SiOCH film has and the less moisture the SiOCH film has absorbed therein. In addition, the amounts of $H_2O$ gases desorbed indicate the results of the measurements performed by using the TDS method. In the TDS method, the temperature of the wafer W having the SiOCH film is increased within a temperature range of 50° C. to 300° C. at a predetermined rate. At each of the temperatures of 150° C., 200° C. and 250° C., the $H_2O$ gases desorbed from the upper surface of the SiOCH film are analyzed by a mass analyzer. The amounts of the $H_2O$ gases desorbed are obtained by integrating indicated peak values corresponding to moisture over the temperature range. The smaller the amount of the $H_2O$ gas desorbed, the smaller the amount of moisture present around the upper surface of the SiOCH film.

TABLE 1

| | Contact angle (degree) | Amount of $H_2O$ gas desorbed |
|---|---|---|
| Experimental Example 1 (150° C.) | 75.3 | $2.5 \times 10^{-10}$ |
| Experimental Example 2 (200° C.) | 61.1 | $3.0 \times 10^{-10}$ |
| Experimental Example 3 (250° C.) | 64.2 | $3.2 \times 10^{-10}$ |
| Comparative Example 1 (without dehydration process using DPM gas) | 6.7 | $4.1 \times 10^{-10}$ |

Based on the results shown in Table 1, the contact angles obtained in Experimental Examples 1 to 3 are larger than the contact angle obtained in Comparative Example 1. Also, the amounts of the $H_2O$ gases desorbed, which are obtained in Experimental Examples 1 to 3 are smaller than that obtained in Comparative Example 1. It is confirmed that a sufficient amount of moisture are released from the upper surface of the SiOCH film in the dehydration process using the DPM gas based on the experimental results. The results (which are both the contact angle and the amount of the $H_2O$ gas desorbed) obtained in Experimental Example 1, in which the wafer W having the SiOCH film is heated to a temperature of 150° C., are the best among those obtained in Experimental Examples 1 to 3. In an additional experiment, the wafer W with the SiOCH film formed thereon is heated to a temperature of 100° C. and subjected to the same dehydration process using the DPM gas, the contact angle and the amount of a $H_2O$ gas desorbed are improved compared with the results obtained in Comparative Example 1.

As described in "Description of the Related Art", moisture contained in the interlayer insulating film 10 causes degradation of the etching operability for forming the Kelvin via hole 110. It is, therefore, apparent that the following method is capable of suppressing degradation of the etching operability. That is, moisture contained in the interlayer insulating film 10 is removed by means of the DPM gas, which represents a gas required for dehydration. After the removal of the moisture, the dehydration process is performed with a portion of the upper surface of the interlayer insulating film 10 exposed. Then, the etching is performed to form the Kelvin via hole 110.

What is claimed is:

1. A method for manufacturing a semiconductor device, comprising the steps of:
    preparing a substrate having an interlayer insulating film formed thereon;
    forming an upper layer film having a mask pattern on an upper surface of the interlayer insulating film present on the substrate in such a manner that a portion of the upper surface of the interlayer insulating film is exposed;
    supplying a gas required for dehydration to the substrate to remove moisture from the interlayer insulating film with the portion of the upper surface of the interlayer insulating film exposed; and
    etching a portion of the interlayer insulating film to form a connection hole in which an electrical connection portion is to be embedded, wherein
    the gas required for dehydration releases a proton (H+) which couples with a hydroxyl group contained in the interlayer insulating film to desorb water vapor from the interlayer insulating film, wherein
    the gas required for dehydration is dipivaloylmethane (DPM), and
    the film, after treatment, has an increased measured contact angle with water or a lower measured amount of moisture remaining in the film.

2. The method according to claim 1, wherein
    the upper layer film includes a cap film formed on the upper surface of the interlayer insulating film and adapted to improve adhesion of the interlayer insulating film to a film present on the cap film or to protect the interlayer insulating film during a post-polishing process, and
    a hole is formed in the cap film so that the portion of the upper surface of the interlayer insulating film is exposed.

3. The method according to claim 2, wherein
    the cap film has a high hygroscopic property.

4. The method according to claim 3, wherein
    the cap film is a silicon oxide film formed from organic liquid vapor containing metal alkoxide.

5. The method according to claim 2, wherein
    the step of forming the upper layer film includes a sub-step of forming a coated film on an upper surface of the cap film, the coated film being removed during the etching.

6. The method according to claim 1, wherein
    the upper layer film includes a sacrificial film, which is removed during the etching.

7. The method according to claim 1, wherein
    the interlayer insulating film is a low dielectric constant film containing silicon, oxygen, carbon and hydrogen.

8. The method according to claim 1, wherein
    the connection hole includes a hole having an electrical connection portion embedded therein and used to evaluate the electrical connection portion serving as a part of an integrated circuit.

9. The method according to claim 1, wherein the moisture is removed from the interlayer insulating film while the substrate, which has the portion of the upper surface of the interlayer insulating film exposed, is heated.

10. The method according to claim 9, wherein
    the substrate having the portion of the upper surface of the interlayer insulating film exposed is heated at a temperature between 50° C. and 300° C.

11. A non-transitory storage medium storing a computer program for causing a computer to execute operations in accordance with a method for manufacturing a semiconductor device, the method comprising the steps of:
 preparing a substrate having an interlayer insulating film formed thereon;
 forming an upper layer film having a mask pattern on an upper surface of the interlayer insulating film present on the substrate in such a manner that a portion of the upper surface of the interlayer insulating film is exposed to an atmosphere;
 supplying a gas required for dehydration to the substrate to remove moisture from the interlayer insulating film with the portion of the upper surface of the interlayer insulating film exposed to the atmosphere; and
 etching a portion of the interlayer insulating film to form a connection hole in which an electrical connection portion is to be embedded, wherein
 the gas required for dehydration releases a proton (H+) which couples with a hydroxyl group contained in the interlayer insulating film to desorb water vapor from the interlayer insulating film, wherein
 the gas required for dehydration is dipivaloylmethane (DPM), and
 the film, after treatment, has an increased measured contact angle with water or a lower measured amount of moisture remaining in the film.

12. A plasma etching method, comprising the steps of:
 preparing a substrate in a process chamber, the substrate having an interlayer insulating film formed thereon in such a manner that a portion of the upper surface of the interlayer insulating film is exposed;
 heating the substrate;
 supplying a gas required for dehydration to the substrate in the process chamber;
 removing moisture from the interlayer insulating film by supplying the gas required for dehydration; and
 etching a portion of the interlayer insulating film, wherein
 the gas required for dehydration releases a proton (H+) which couples with a hydroxyl group contained in the interlayer insulating film to desorb water vapor from the interlayer insulating film,
 the gas required for dehydration is dipivaloylmethane (DPM), and
 the film, after treatment, has an increased measured contact angle with water or a lower measured amount of moisture remaining in the film.

13. The plasma etching method according to claim 12, wherein
 the removing of moisture is performed by heating the substrate at a temperature between 50° C. and 300° C.

* * * * *